United States Patent
Asiri et al.

(10) Patent No.: US 9,847,151 B2
(45) Date of Patent: Dec. 19, 2017

(54) METHOD OF MAKING AND USING FLEXIBLE ELASTIC NANOTUBE COMPOSITE

(71) Applicant: THE CENTER OF EXCELLENCE FOR ADVANCED MATERIALS RESEARCH (CEAMR), Jeddah (SA)

(72) Inventors: Abdullah Mohamed Asiri, Jeddah (SA); Sher Bahadar Khan, Jeddah (SA); Muhammad Tariq Saeed Chani, Jeddah (SA); Khasan Karimov, Jeddah (SA)

(73) Assignee: King Abdulaziz University, Jeddah (SA)

( * ) Notice: Subject to any disclaimer, the term of this patent is extended or adjusted under 35 U.S.C. 154(b) by 0 days.

(21) Appl. No.: 14/536,752

(22) PCT Filed: Jul. 8, 2014

(86) PCT No.: PCT/IB2014/062948
§ 371 (c)(1),
(2) Date: Nov. 10, 2014

(87) PCT Pub. No.: WO2016/005792
PCT Pub. Date: Jan. 14, 2016

(65) Prior Publication Data
US 2017/0148969 A1    May 25, 2017

(51) Int. Cl.
*H01B 1/04* (2006.01)
*B82Y 30/00* (2011.01)
(Continued)

(52) U.S. Cl.
CPC .............. *H01B 1/04* (2013.01); *B82Y 30/00* (2013.01); *B82Y 40/00* (2013.01); *C01G 51/04* (2013.01); *H01B 1/08* (2013.01); *H01L 35/32* (2013.01)

(58) Field of Classification Search
CPC .. H01B 1/04; H01B 1/08; H01L 35/10; H01L 35/20; H01L 35/22; H01L 35/225;
(Continued)

(56) References Cited

U.S. PATENT DOCUMENTS

2011/0206932 A1* 8/2011 Waki .................. B82Y 30/00
428/400
2011/0268647 A1* 11/2011 Ivanovici .............. B01J 21/08
423/448

(Continued)

FOREIGN PATENT DOCUMENTS

GB  WO 2014125292 A1 * 8/2014 ............. H01L 35/22
WO  WO 2014081387 A1 * 5/2014 ............. B82Y 40/00

OTHER PUBLICATIONS

Guan et al., "Needle-like Co3O4 anchored on the graphene with enhanced electrochemical performance for aqueous supercapacitors." ACS Appl. Mater. Interfaces, 6, 7626-7632 (2014).*
Wu et al., "Graphene anchored with Co3O4 nanoparticles as anaode of lithium ion batteries with enhanced reversible capacity and cyclic performance." ACS Nano, vol. 4, No. 6, 3187-3194 (2010).*
Wang et al., "Facile and green synthesis of Co3O4 nanoplates/graphene nanosheets composite for supercapcitor." J. Solid State Electrochem. 16:3593-3602 (2012).*
Xu et al., "Deposition of Co3O4 nanoparticles onto exfoliated graphite oxide sheets." J. Mater. Chem. 18, 5625-5629 (2008).*

*Primary Examiner* — Harold Pyon
*Assistant Examiner* — Matthew R Diaz
(74) *Attorney, Agent, or Firm* — Geeta Kadambi; Riddhi IP LLC

(57) ABSTRACT

A method of fabricating and using of flexible elastic photo-thermoelectric or thermoelectric cells is being presented, where the thermoelectric materials have been used in nanohybrid (pristine form). The casing of the cells is made up of flexible elastic materials (plastic, rubber). The casing may have different shapes as rod, semi-circular, wave-form, spiral etc., that makes them easy for practical applications and the thermoelectric cells can potentially provide high efficiency. The flexible thermoelectric cells based on carbon nano-tubes (CNT) and its blend with cobalt oxide/graphene oxide nanohybrid have been made and tested.

5 Claims, 7 Drawing Sheets

(51) Int. Cl.
*B82Y 40/00* (2011.01)
*C01G 51/04* (2006.01)
*H01B 1/08* (2006.01)
*H01L 35/32* (2006.01)

(58) Field of Classification Search
CPC ......... H01L 35/24; H01L 35/28; H01L 35/30;
H01L 35/32; C01B 31/043; C01G 51/00;
C01G 51/04; H01M 4/131; H01M 4/133;
H01M 4/1391; H01M 4/1393; H01M
4/625; H01G 11/36; H01G 11/38; H01G
11/42; B82Y 30/00; B82Y 40/00
See application file for complete search history.

(56) References Cited

U.S. PATENT DOCUMENTS

| | | | | |
|---|---|---|---|---|
| 2012/0264034 | A1* | 10/2012 | Waki | H01M 4/90 |
| | | | | 429/482 |
| 2014/0346408 | A1* | 11/2014 | Yun | C01B 31/043 |
| | | | | 252/503 |
| 2015/0298976 | A1* | 10/2015 | Lee | B82Y 40/00 |
| | | | | 428/702 |

* cited by examiner

METHOD OF MAKING AND USING FLEXIBLE ELASTIC NANOTUBE COMPOSITE

CROSS REFERENCE TO RELATED APPLICATION

This application claims priority to PCT/IB2014/062948 filed on 8 Jul. 2014 and hereby incorporated by reference in its entireties for all of its teachings.

FIELD OF TECHNOLOGY

This disclosure generally relates to nano-powder for using in a photo-thermoelectric cell. More specifically using cobalt oxide/graphene oxide/carbon nanotube powder to be used as elastic nanocomposite.

BACKGROUND

With the expanding human population, the demand for energy is increasing continuously. By the year 2050, the expected world population will be 10.6 billion and the energy demand will also become double because of industrialization of societies and better life standard. Heat energy can be converted into electric energy by the use of thermoelectric generators having thermoelectric cells or Seebeck cells (Bell L. E. (2008), Shelimov et al. (2008)). These generators and cells can convert light energy that is transformed into heat (Baglio et. al. (2003), Xu et. al. (2009)). The graphene based samples having the structure of the field effect transistor with source, drain and gate were fabricated by Basko D. (2011). He observed photo-thermoelectric effect under the effect of the laser light, which was the sum of thermoelectric, or Seebeck effect and the photovoltaic effect due to charge separation by the electric field of the applied to gate voltage. It may be used for developing graphene-based optoelectronic devices. The photo-thermoelectric generator integrating dye-sensitized solar cells (DSSC) with thermoelectric modules were fabricated and investigated by Chang et al. (2010). Moreover the Seebeck cells can be used in instrumentation for the measurement of temperature gradient at different technological processes and meters for gas (CO, $CH_4$ and $C_2H_5OH$) concentration (Papadopoulos (1996). As a rule thermoelectric cells have a fixed shape and are made of thermoelectric materials; mostly semiconductors by casting from melt, pressing, fabrication from past etc. At present thermoelectric generators and cells are in use for conversion of heat energy into electric energy. Recently high energy conversion efficiency of 15% is observed using thin layers of n-Si/SiGe-p-$B_4C/B_9C$ nanomaterials deposited on silicon substrates. In all these nanomaterials based thermoelectric cells, the nanomaterials are used in the form of bulky (rods) or thin layers. However, there is a need for a better composite that will fit every need to create electricity in an efficient way.

SUMMARY

The invention discloses a method of making and using a nanohybrid to be used for making thermoelectric cell is being described. The instant invention also discloses a method of making flexible elastic photo-thermoelectric or thermoelectric cells is being presented.

In one embodiment, thermoelectric cell is made up of a casing and the casing filled with nanohybrid. In another embodiment, the casing may be of flexible materials such as plastic and/or rubber. In another embodiment, the casing may be of several different shapes such as rod, semi-circular, wave form, spiral etc., which makes them easy for practical applications and the cells to provide high efficiency.

In one embodiment, carbon nano-tubes (CNT) is blended with cobalt oxide/graphene oxide nanohybrid is fabricated and tested. In another embodiment, cobalt oxide/graphene oxide nanohybrid is synthesized using one pot synthesis method. In one embodiment, cobalt oxide is grown on graphene oxide sheets in spherical form. In one embodiment the CNT's are blended with cobalt oxide/graphene oxide nano-particle.

In another embodiment, characterizations of several properties of the novel cobalt oxide/graphene oxide nanohybrid were performed. These characterizations were performed to prove the efficacy and effectiveness of the novel nanohybrid thermoelectric property.

The novel nanohybrid composition, method of synthesizing and method of using the novel nanohybrid in flexible thermoelectric cells, disclosed herein, may be implemented in any means for achieving various aspects. Other features will be apparent from the accompanying figures and from the detailed description that follows.

BRIEF DESCRIPTION OF THE DRAWINGS

Example embodiments are illustrated by way of example and no limitation in the tables and in the accompanying figures, like references indicate similar elements and in which.

Other features of the present embodiments will be apparent from the accompanying figures and the detailed description that follows.

DETAILED DESCRIPTION

Several embodiments for a method of making of fabricating flexible elastic thermo-electric cell, method of using the flexible thermo-electric cell filled with nanohybrid for efficient conductance of the power are disclosed. Although the present embodiments have been described with reference to specific example embodiments, it will be evident that various modifications and changes may be made to these embodiments without departing from the broader spirit and scope of the various embodiments.

In this invention the fabrication and testing of flexible elastic photo-thermoelectric or thermoelectric cells is being presented, where the thermoelectric materials have been used in pristine form (nanohybrid). The casing of the photo-thermoelectric or thermoelectric cell is made up of flexible elastic materials (plastic, rubber). The casing may have different shapes as rod, semi-circular, wave-form, spiral etc., that makes them easy for practical applications and the thermoelectric cell can potentially provide high efficiency. The flexible thermoelectric cells based on carbon nano-tubes (CNT) and its blend with cobalt oxide/grapheme oxide nanohybrid have been made/fabricated and tested.

Figure 1:
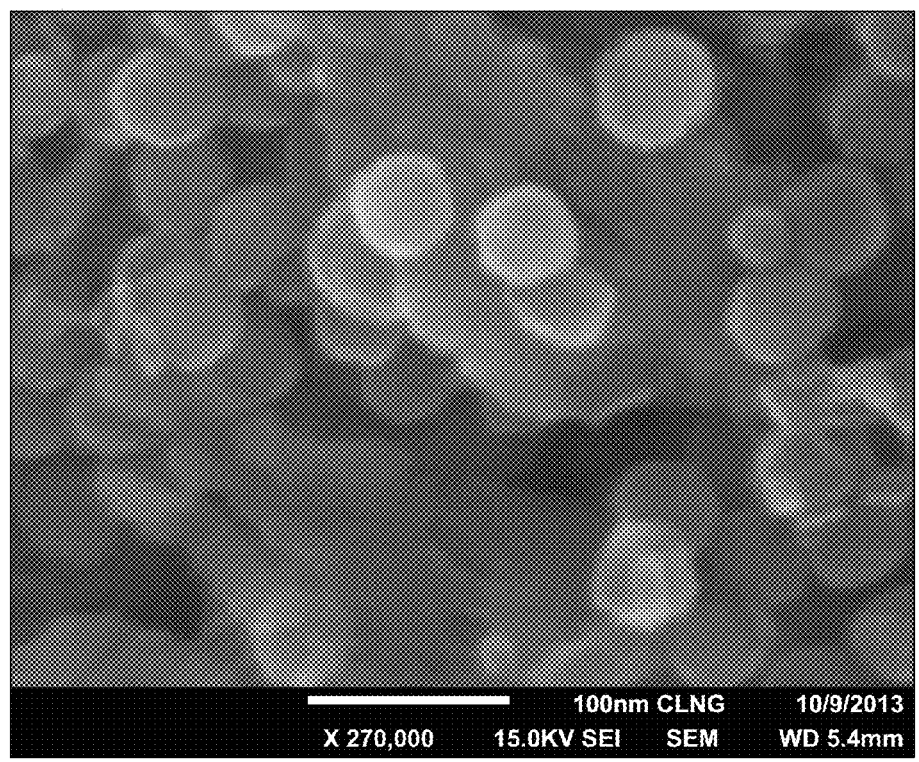
FIG. 1 shows low magnification FESEM images of cobalt oxide/graphene oxide nanohybrid are shown.

Multi-walled nanotubes (MWNTs) powder used for the method of fabrication of thermoelectric cell is commercially produced by Sun Nanotech Co Ltd., China. The diameter of these CNTs varied between 10-30 nm. The $Co_3O_4$/graphene oxide nanohybrid was synthesized by using one pot synthesis method. To grow $Co_3O_4$/graphene oxide nanohybrid, 0.1 M of cobaltous nitrate hexa-hydrate ($Co(NO_3)_2.6H_2O$) was first homogeneously dissolved in deionized water and then 1 wt % of graphene oxide was well dispersed into homogeneous $Co^{2+}$ solution. Afterwards, solution's pH was being adjusted to 10.0 by drop wise addition of 0.1 M NaOH. The mix solution was being stirred at 60° C. for overnight and product was being washed with ethanol, dried in air and preserve in inert sample vials. The synthesized $Co_3O_4$/graphene oxide nanohybrid was characterized morphologically by JEOL Scanning Electron Microscope (JSM-7600F, Japan) and X-ray diffraction patterns (XRD) using a computer controlled X'Pert Explorer, PANalytical diffractometer ranging from 2Θ 10-70°. Generally graphene oxide have sheet like morphology (Niu et al. (2012)). The low magnified image (FIG. 1) of synthesized $Co_3O_4$/graphene oxide nanohybrid showed, that the nanoparticles are grown on the surface of nanosheets, which indicate that cobalt oxide is grown in the form of nanoparticles on the surface of graphene oxide nanosheets. The magnified images (FIG. 1) illustrated that the as-grown cobalt oxide nanoparticles have spherical shape with average size of almost ~30 nm.

Figure 2:
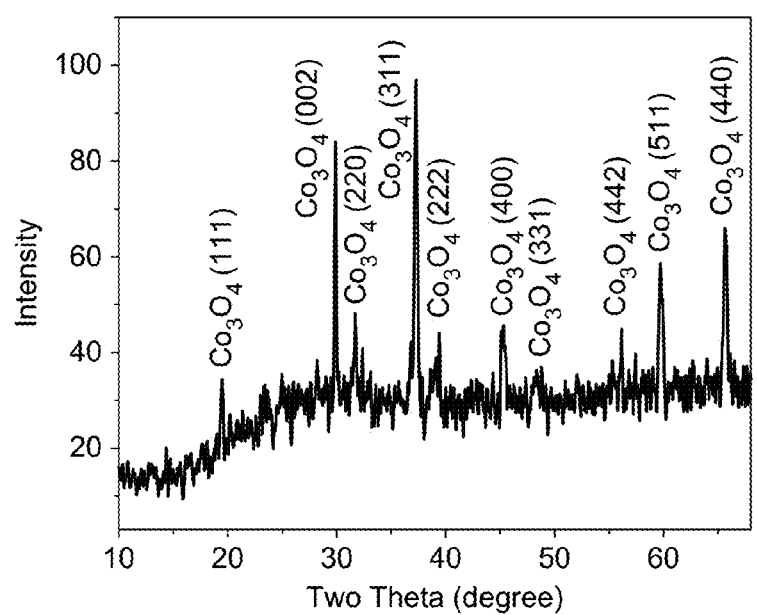
FIG. 2 XRD spectrum of the cobalt oxide/graphene oxide nanohybrid is shown.

Crystal structure of $Co_3O_4$/graphene oxide nanohybrid was examined by X-ray powder diffraction (FIG. 2). The XRD pattern displayed well crystalline peaks which are responsible for tetragonal $Co_3O_4$ at 2Θ of 18.98, 29.37, 31.27, 36.82, 38.88, 44.73, 47.95, 55.55, 59.21 and 65.21° (Bhattacharjee et al. (2013), Yang et al. (2010)). Thus XRD spectrum identified that the cobalt phase in nanohybrid exist as $Co_3O_4$.

Figure 3:
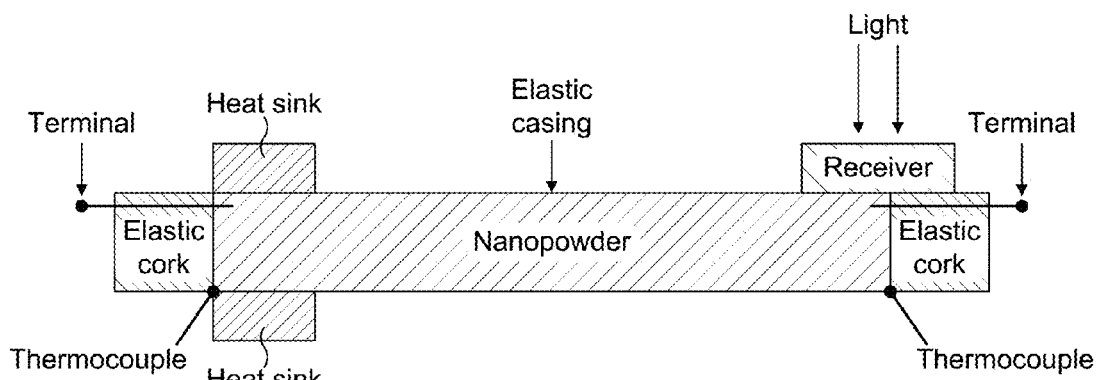
FIG. 3 schematic diagram of the rod-shaped flexible elastic casings are shown.
Figure 4:
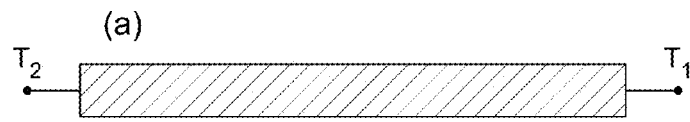
FIG. 4 schematic diagram of the different shaped flexible elastic casings are shown.
Figure 4:
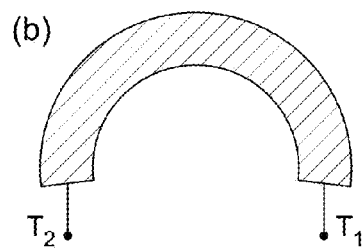
Figure 4:
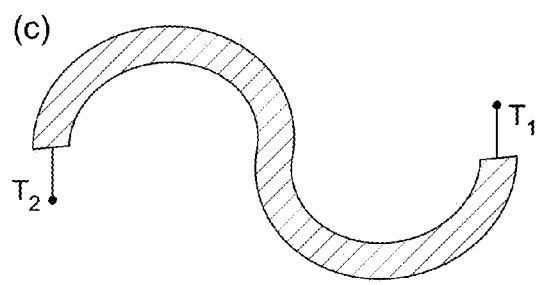
Figure 4:
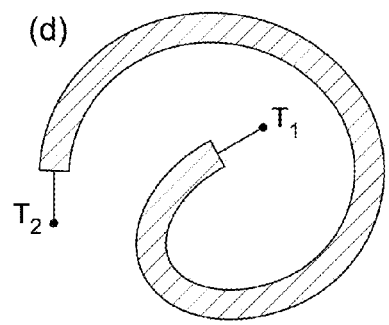

Carbon nano-tubes (CNT) and its blend with graphene oxide-Co oxides were used as thermoelectric materials in order to test flexible photo-thermoelectric cells. The casing of fabricated thermoelectric cells was made from plastic and rubber tubes of diameter of 3-4 mm and length of 1-5 cm. The tubes were filled by powder of CNTs or their composites with graphene oxide-Co oxide nanohybrid. FIG. 3 shows schematic diagram of the rod-shaped flexible elastic photo-thermoelectric cell based on graphene oxide nanocomposites and investigation of its properties. The FIG. 4 shows different shapes of the flexible elastic photo-thermoelectric cells: rod-shape (a), semicircular (b), wave (c) and spiral (d) shapes.

To fabricate the cell the terminal (fine metallic wire) was introduced from one of the sides of tube and it was closed by elastic cork. From the other opened side first the tube was filled by nanohybrid and then the second terminal was introduced and the elastic cork was also inserted in this side. Finally, on both ends of the cell tube the elastic cork and the terminals were fixed by glue (FIG. 3).

The samples were investigated under the effect of filament light that was used as energy source; the area of 4:4 mm² was illuminated on one side (hot side) of the cell, which was blackened and played the role of receiver. On the other side of the sample (cold side) the heat sink was fixed. The temperature gradient (difference) between illuminated and non-illuminated (cold) sides was measured by using thermocouples (FIG. 3). For the measurement of voltage, current, intensity of light and temperature various devices such as multimeter FLUKE 87, multimeter 3256 HiTESTER, LCR meter MT 4090, luxmeter LM-80 and illuminometer JIM-100 were used. The filament lamp of power 100 W was used as a light source.

Figure 5:
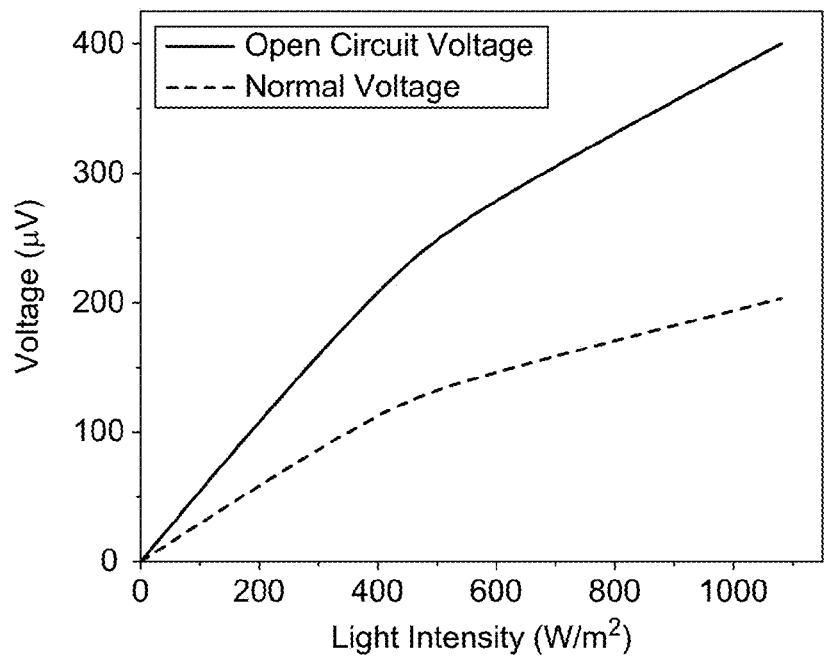
FIG. 5 and FIG. 6 show open-circuit voltage ($V_{oc}$)-light intensity and normal voltage at maximum power point ($V_n$)-light intensity relationships.
Figure 6:
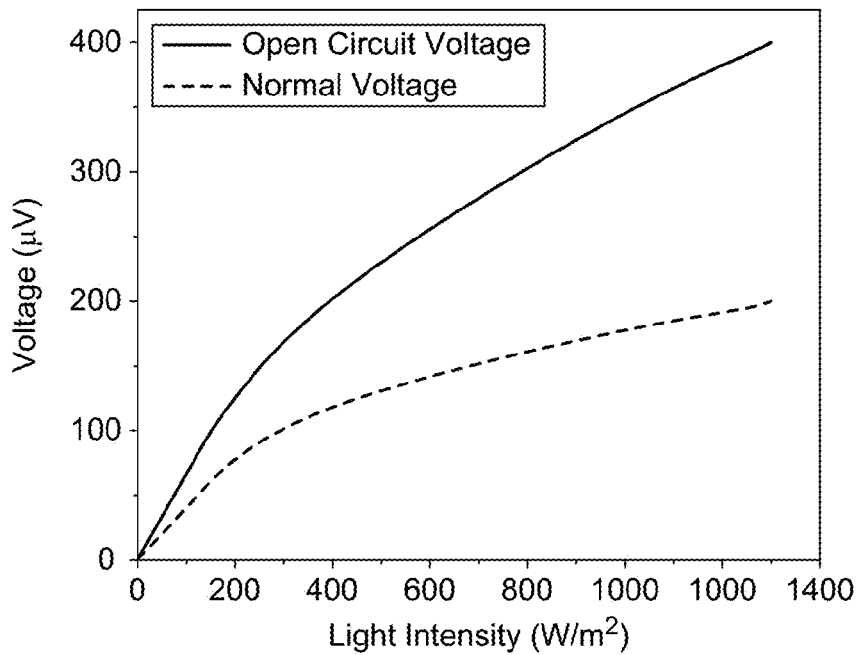
Figure 7:
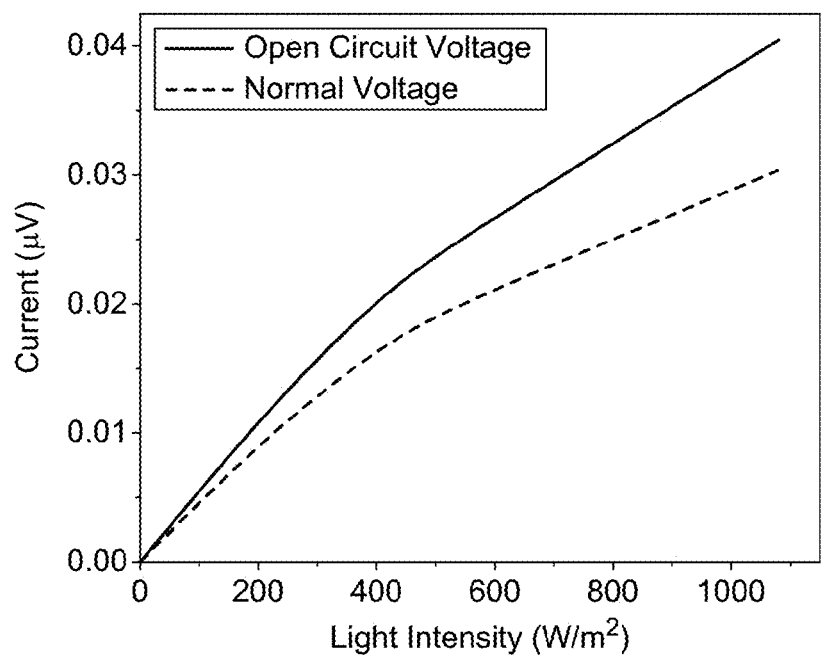
FIG. 7 and FIG. 8 shows short-circuit current ($I_{sc}$) and normal current at maximum power point ($I_n$) versus light intensity relationships.
Figure 8:
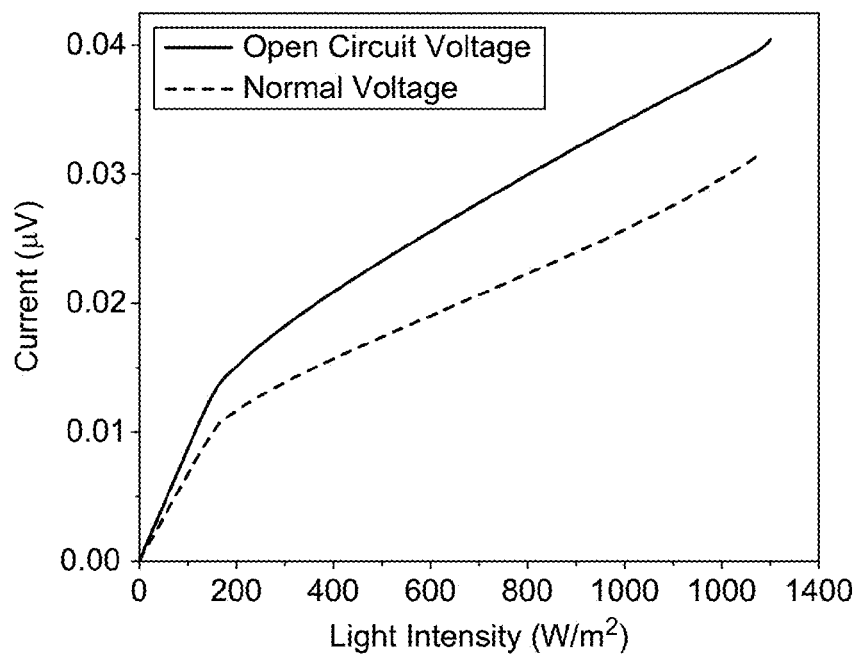
Figure 9:
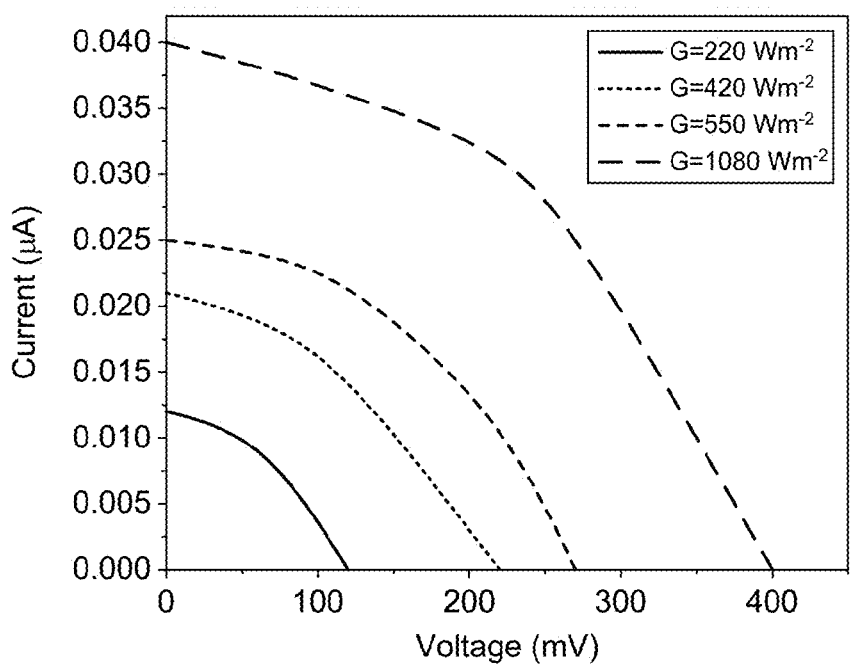
FIG. 9 and FIG. 10 show current-voltage relationships at different light intensities for the CNTs nanohybrid and blend of CNTs (70 wt %) and graphene oxide-Co oxide (30 wt %).
Figure 10:
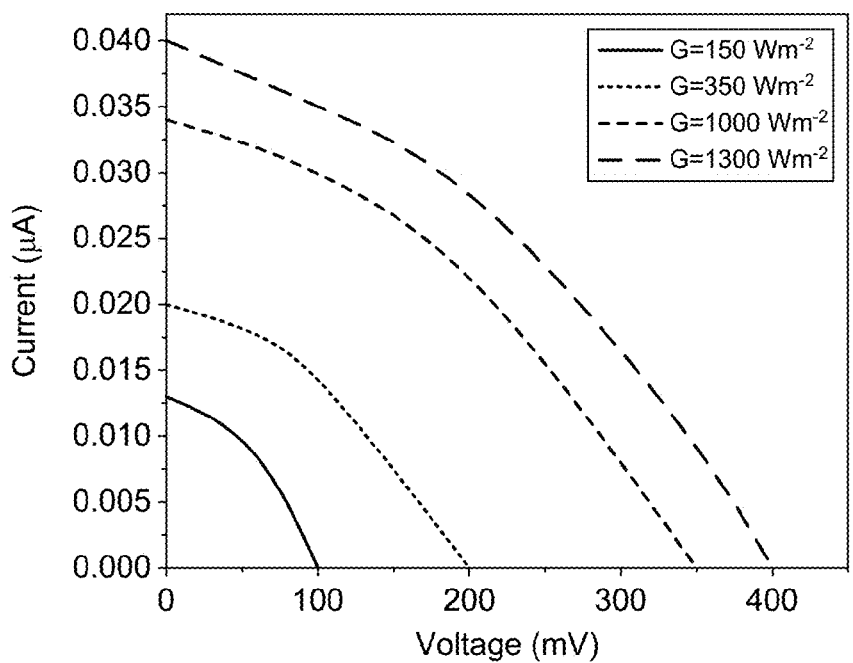

FIG. 5 and FIG. 6 show open-circuit voltage ($V_{oc}$)-light intensity and normal voltage at maximum power point ($V_n$)-light intensity relationships for the CNTs nanohybrid and the blend of CNTs (70 wt. %) and graphene oxide-Co oxide (30 wt. %). FIG. 7 and FIG. 8 show short-circuit current ($I_{sc}$) and normal current at maximum power point ($I_n$) versus light intensity relationships for the CNTs nanohybrid and blend of CNTs (70 wt. %) and graphene oxide-Co oxide (30 wt. %). Accordingly, FIG. 9 and FIG. 10 show current-voltage relationships at different light intensities for the CNTs nanohybrid and blend of CNTs (70 wt. %) and graphene oxide-Co oxide (30 wt. %). It can be seen that all these relationships have similar behavior for the CNTs nanohybrid and blend of CNTs (70 wt. %) and graphene oxide-Co oxide (30 wt. %). All the above figures shows that if sample is illuminated and light increases the differences of temperature or gradient of temperature between 'hot' and 'cold' terminals of the cell increases, In the 'hot' side concentration and sometime velocity of charges increases, in the result the diffusion of charges take place from 'hot' side to 'cold' which bring to differences of electric potential or generation of voltage between hot and cold sides and accordingly flowing of current if external electric loop is closed.

Figure 11:
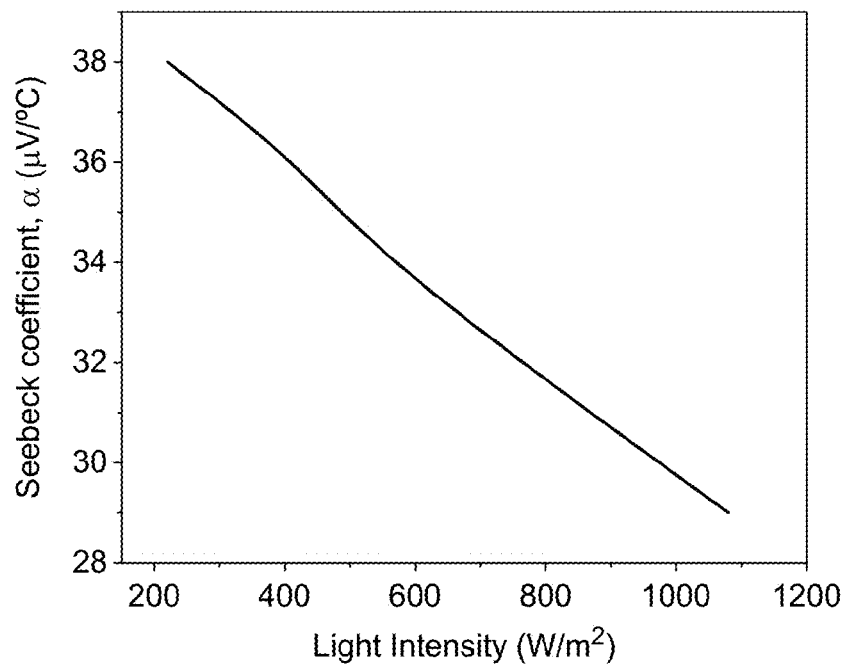
FIG. 11 and FIG. 12 show Seebeck coefficients-light intensities relationships.
Figure 12:
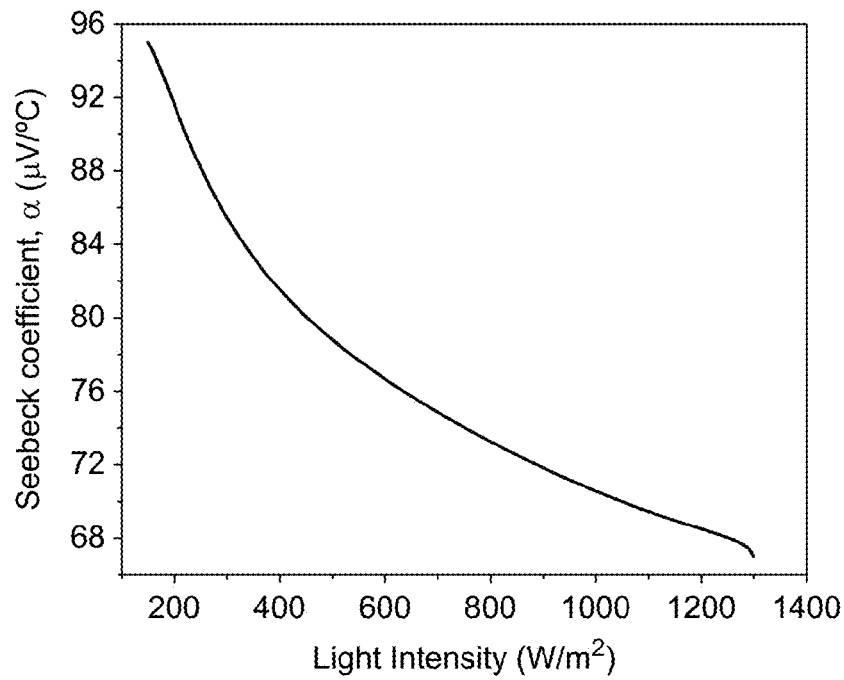
Figure 13:
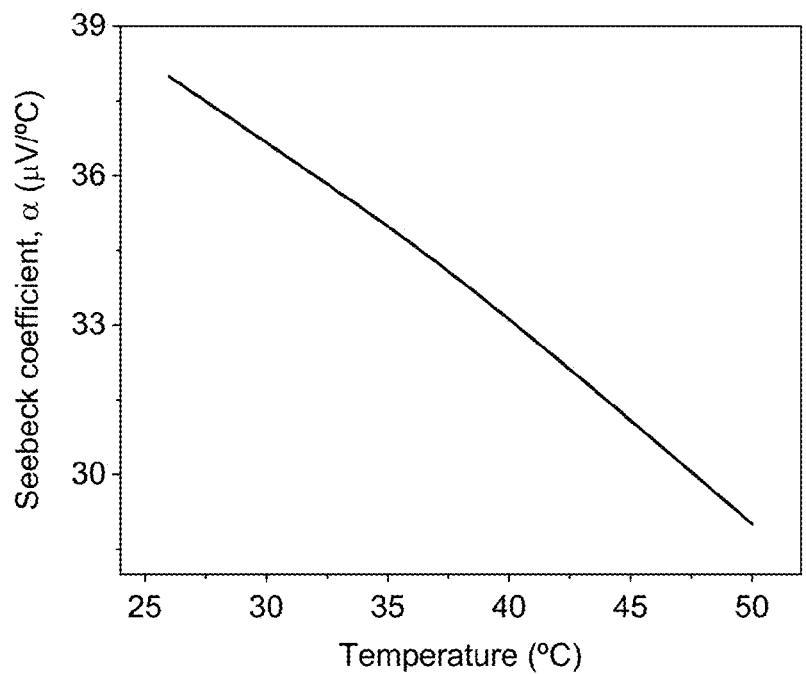
FIG. 13 and FIG. 14 show Seebeck coefficients-temperature relationships.
Figure 14:
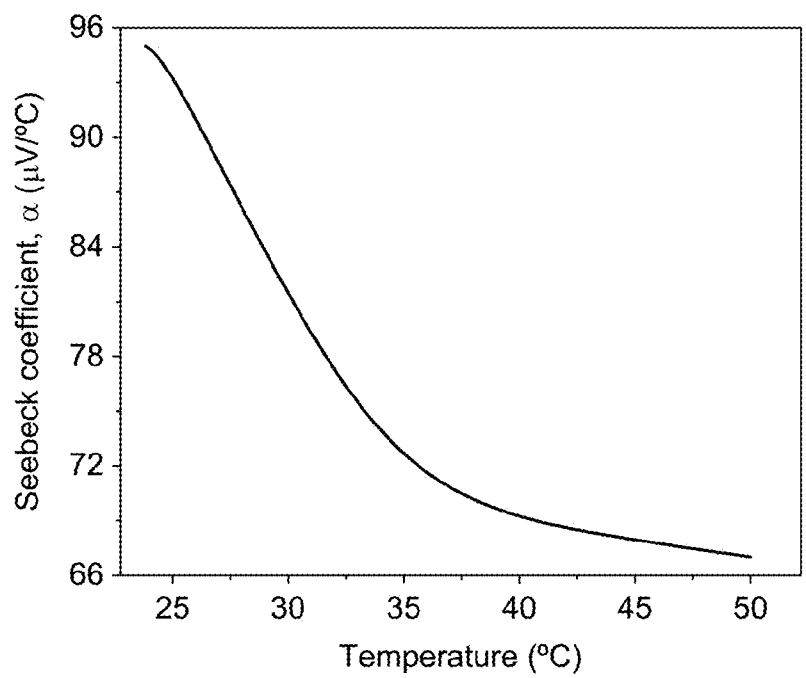

FIG. 11 and FIG. 12 show Seebeck coefficients-light intensities relationships, while the FIG. 13 and FIG. 14 show Seebeck coefficients-temperature relationships for the CNTs nanohybrid and blend of CNTs (70 wt. %) and graphene oxide-Co oxide (30 wt. %). These figures show dependences of Seebeck coefficients of intensity of light or temperature. Seebeck coefficients are actually equal to ratio of voltage to gradient of temperature. It can be seen that Seebeck coefficient behaviors are similar but the value of Seaback coefficient in the blend of CNTs (70 wt. %) and graphene oxide-Co oxide (30 wt. %) is approximately two times larger than in the CNTs nanohybrid. It means that if the pure CNTs show slightly semiconductive behavior, probably graphene-Co-oxide is good semiconductor that can be made clear in future experiments.

As it was found the Seebeck coefficient in the samples of CNTs (70 wt. %) and $Co_3O_4$/graphene oxide nanohybrid (30 wt. %) blend is approximately two times larger than in the samples of pure CNTs nanohybrid. As it is well known that the Seebeck coefficient is larger in semiconductors than in metals (Bell L. E. 2008). It means that the $Co_3O_4$/graphene oxide nanohybrid in the blade plays the role of semiconductive materials.

INDUSTRIAL APPLICABILITY

Advantages of the invention are the following: As a novel nanomaterial it is used for fabrication of the photo-thermoelectric cells the properties cannot be affected and made worse by use of some adhesive or any other materials that is not actually good enough for thermoelectric applications. In the form of the powder it has porous structure, unlike to bulky material the creation of gradient of temperature is easier and it is sufficiently large due to the lower thermal conductance. The modular nature of this structure makes the photo-thermoelectric cell is easier to assemble and disassemble, repair, recycle and dispose if it is necessary. The flexible elastic photo-thermoelectric cell can use not only the light energy, but can be adapted for the use of any heat energy (gas, coal, wood etc.) including the human body's heat. The flexible elastic photo-thermoelectric cell can also be used in instrumentation for the measurement of temperature gradient (differences) including bio-medical applications. The flexible elastic photo-thermoelectric cells fabrication is simple and cheap and can be done not only at room temperature but at lower temperatures or elevated temperatures as well depending on the kind of materials that will be used for casing and conditions. In addition, the specification and drawings are to be regarded in an illustrative rather than as in a restrictive sense.

What is claimed is:

1. A method of making a nanohybrid material for a thermoelectric cell, comprising:
    dissolving 0.1M of cobaltous nitrate hexa-hydrate in a deionized water to make a homogeneous solution 1;
    adding 1 wt % of a graphene oxide to the homogeneous solution 1 to form a mixed solution;
    adjusting the pH of the mixed solution to 10;
    stirring the pH adjusted mixed solution at 60° C. to obtain a stirred solution;
    washing the stirred solution with an ethanol and air drying to obtain a $Co_3O_4$/graphene oxide nanohybrid material, and
    blending a carbon nano tube at 70 wt. % with the $Co_3O_4$/graphene oxide nanohybrid material at 30 wt. % to obtain a blend for filling a casing for the thermoelectric cell.

2. The method of claim 1, further comprising:
    filling a casing with the carbon nano tube at 70 wt. % with the $Co_3O_4$/graphene oxide nanohybrid material at 30 wt. % blend; and
    measuring a thermoelectric effect by Seebeck coefficients-light intensity relationship test of the filled casing for the thermoelectric cell with carbon nano tube at 70 wt. % with the $Co_3O_4$/graphene oxide nanohybrid material at 30 wt. %.

3. The method of claim 2, wherein the casing is at least one of a plastic and rubber.

4. The method of claim 2, wherein the casing is shaped in at least one a rod-shape, semicircular, wave and spiral shape.

5. The method of claim 1, wherein the cobaltous nitrate hexa-hydrate forms a crystal on the graphene oxide which is in form of a sheet.

* * * * *